United States Patent
Yamazaki (10) Patent No.: US 7,761,759 B2
(45) Date of Patent: Jul. 20, 2010

(54) SEMICONDUCTOR INTEGRATED CIRCUIT

(75) Inventor: Tatsuhiko Yamazaki, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 563 days.

(21) Appl. No.: 11/751,117

(22) Filed: May 21, 2007

(65) Prior Publication Data

US 2008/0010570 A1    Jan. 10, 2008

(30) Foreign Application Priority Data

Jun. 20, 2006    (JP) .............................. 2006-170251

(51) Int. Cl.
    *G01R 31/28*    (2006.01)
(52) U.S. Cl. .................. 714/726; 714/729; 714/731
(58) Field of Classification Search .................. 714/726, 714/729, 731
    See application file for complete search history.

(56) References Cited

U.S. PATENT DOCUMENTS

| 5,252,917 | A | 10/1993 | Kadowaki | 324/158 R |
| 7,185,249 | B2* | 2/2007 | Tkacik et al. | 714/726 |
| 7,200,784 | B2* | 4/2007 | Dervisoglu et al. | 714/731 |
| 7,487,418 | B2* | 2/2009 | Kayukawa et al. | 714/727 |
| 2004/0153801 | A1 | 8/2004 | Kayukawa et al. | 714/30 |
| 2007/0226562 | A1* | 9/2007 | Tkacik et al. | 714/726 |

FOREIGN PATENT DOCUMENTS

| JP | 63-134970 | 6/1988 |
| JP | 4-72583 | 3/1992 |
| JP | 2004-117029 | 4/2004 |

\* cited by examiner

*Primary Examiner*—John J Tabone, Jr.
(74) *Attorney, Agent, or Firm*—Fitzpatrick, Cella, Harper & Scinto (57) ABSTRACT

A semiconductor integrated circuit comprises a test mode decision circuit which decides a normal operation mode or a test mode when having input a clock from a reset state and started an operation by using a scan enable signal that is used for a scan test, and retains a decision result until the decision result is reset; a scan enable mask circuit which disables the transmission of a scan enable signal to an internal scan circuit according to a decision result signal; and an access control unit which disables the access to the internal memory unit according to the decision result signal output from the test mode decision circuit. Furthermore, the semiconductor integrated circuit has a configuration of using the scan enable signal and the normal operation input signal in common.

7 Claims, 8 Drawing Sheets

SEMICONDUCTOR INTEGRATED CIRCUIT

BACKGROUND OF THE INVENTION

1. Field of the Invention

The present invention relates to a semiconductor integrated circuit such as an LSI, in particular, relates to a semiconductor integrated circuit having a scan circuit arranged therein.

2. Description of the Related Art

A semiconductor integrated circuit such as an LSI conventionally has a scan circuit therein which is arranged for the purpose of determining whether the semiconductor integrated circuit has a defect formed in a manufacturing process or not. For instance, Japanese Patent Application Laid-Open No. S63-134970 and Japanese Patent Application Laid-Open No. H04-072583 describe a testing technique with the use of the scan circuit.

Figure 5:
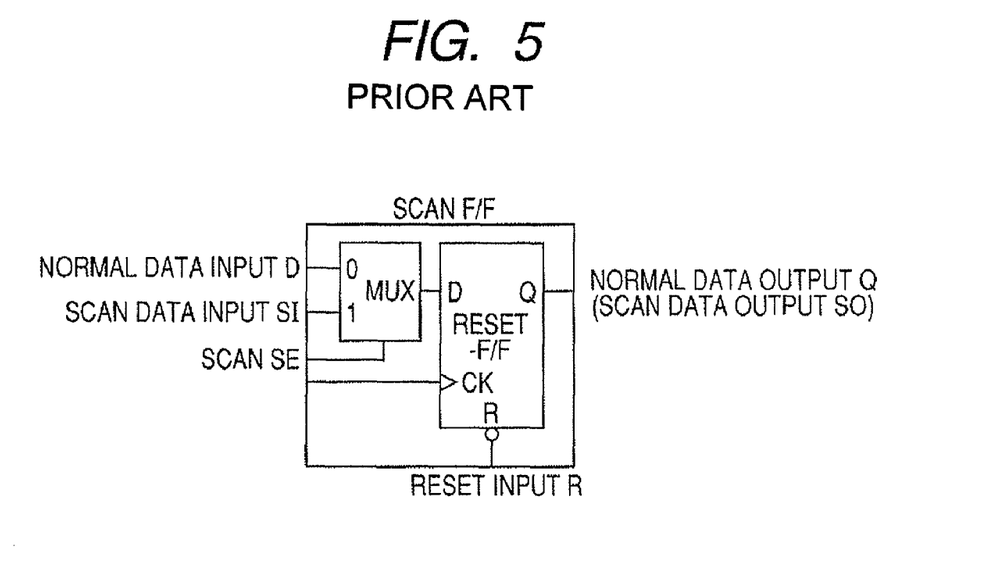
FIG. 5 is a circuit diagram illustrating a configuration of a scan-FF.

The scan circuit uses a scan flip-flop (hereafter referred to as an FF) as shown in FIG. 5, for instance.

FIG. 5 illustrates a configuration for forming a scan-FF by using a flip-flop (hereafter referred to as an FF) provided with a reset terminal.

A multiplex function (MUX) is added to an input (D) of the above described FF with the reset terminal. The R-FF (flip-flop with reset terminal) can make the multiplex function select a normal data input (D) when a scan enable signal is logic zero, and a scan data (SI) when the scan enable signal is logic one, and can employ the input as the input (D) of the R-FF.

Figure 6:
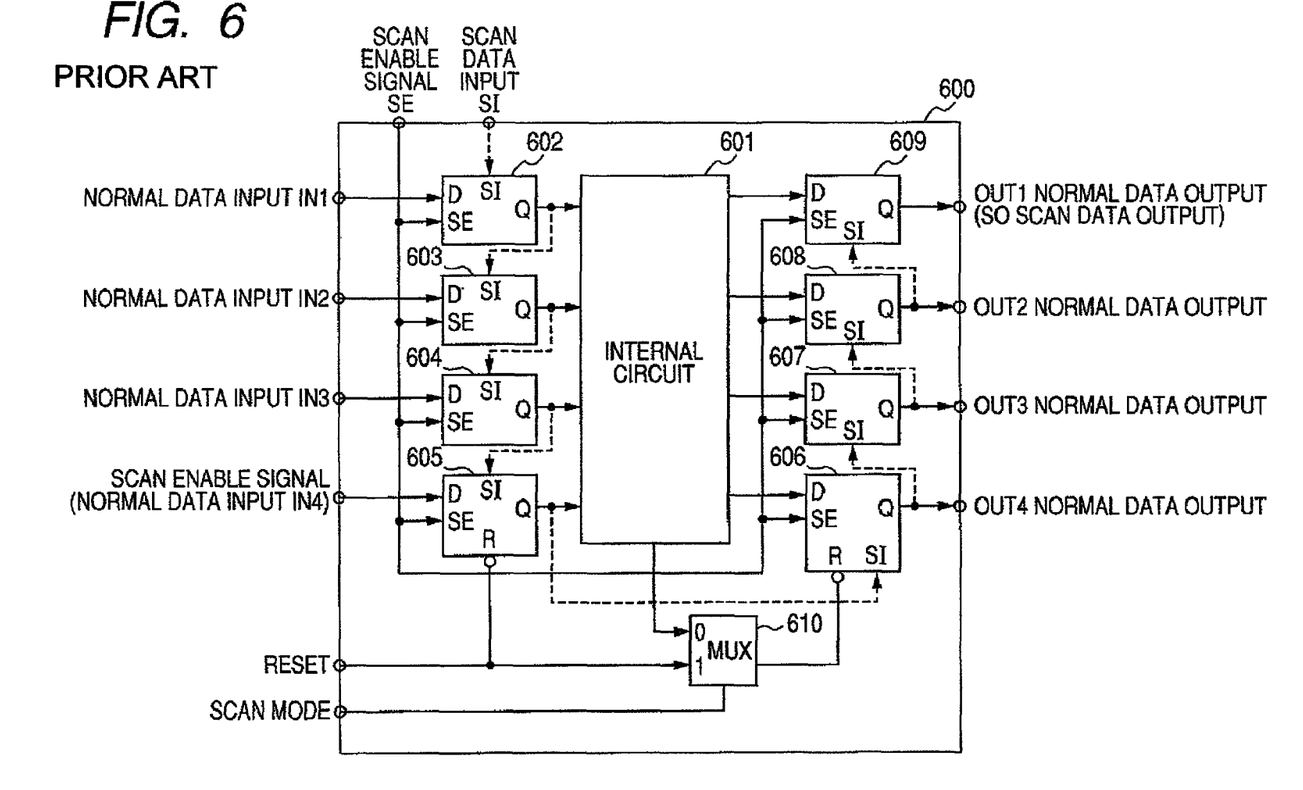
FIG. 6 is a circuit diagram illustrating a scan test circuit in a conventional example.

FIG. 6 illustrates a conventional example of adding a scan circuit using the scan-FF to a semiconductor integrated circuit.

FIG. 6 illustrates a configuration which has scan-FFs 602 to 609 arranged for an input/output signal of an internal circuit 601 of a semiconductor integrated circuit 600. When a scan enable signal SE shows logic zero, data is input from normal data input terminals IN1 to IN4; and an internal circuit operates to output a processing result in the internal circuit to normal data output terminals OUT1 to OUT4.

On the other hand, when a scan enable signal shows logic one, scan-FFs 602 to 609 set scan data SI as an input source and form a shift register configuration (scan chain). The scan-FFs 602 to 609 shifting-output the data, and then, the test result can be observed from a scan data output SO.

A scan test consists of two operations. The first operation is to set the above described scan enable signal at logic one, and set an arbitrary data value to scan-FFs 602 to 605 (scan shift operation).

The next operation is to set the scan enable signal at logic zero, make the internal circuit operate by using the above described set data value, and make the scan-FFs 606 to 609 capture a processing result (scan capture operation).

The scan test is performed by alternately repeating the above described two operations.

In FIG. 6, the scan-FF606 has further a reset terminal R. This reset terminal R is controlled by an internal logic circuit in a normal operation.

However, in a scan test, the reset terminal is configured to reset the above described scan-FF606 by its signal so as to prevent the scan-FF606 from unintentionally being reset.

Specifically, the above semiconductor integrated circuit 600 has a multiplexer 610 arranged in an input section for the reset terminal R of the scan-FF606, and sets a scan mode at logic one during scan test.

As described above, it becomes easy to determine whether the internal circuit works well or not, by arranging a scan circuit and freely reading and writing a data value retained in an FF in the semiconductor integrated circuit. However, on the other hand, the following malfunctions may occur in an LSI which treats security data such as a cryptogram.

1. It is possible to draw out security data by reading out a data value for the FF.

2. It is possible to rewrite the security data by writing a different data value.

3. It is possible to control an internal memory unit (RAM), and read and write the data by operating the data value for the FF.

A conventional example for preparing the above situation will be shown which is a semiconductor integrated circuit that prevents security data stored in an LSI from being read out or rewritten by fraudulent means and simultaneously can test the semiconductor integrated circuit by using a scan circuit.

Figure 7:
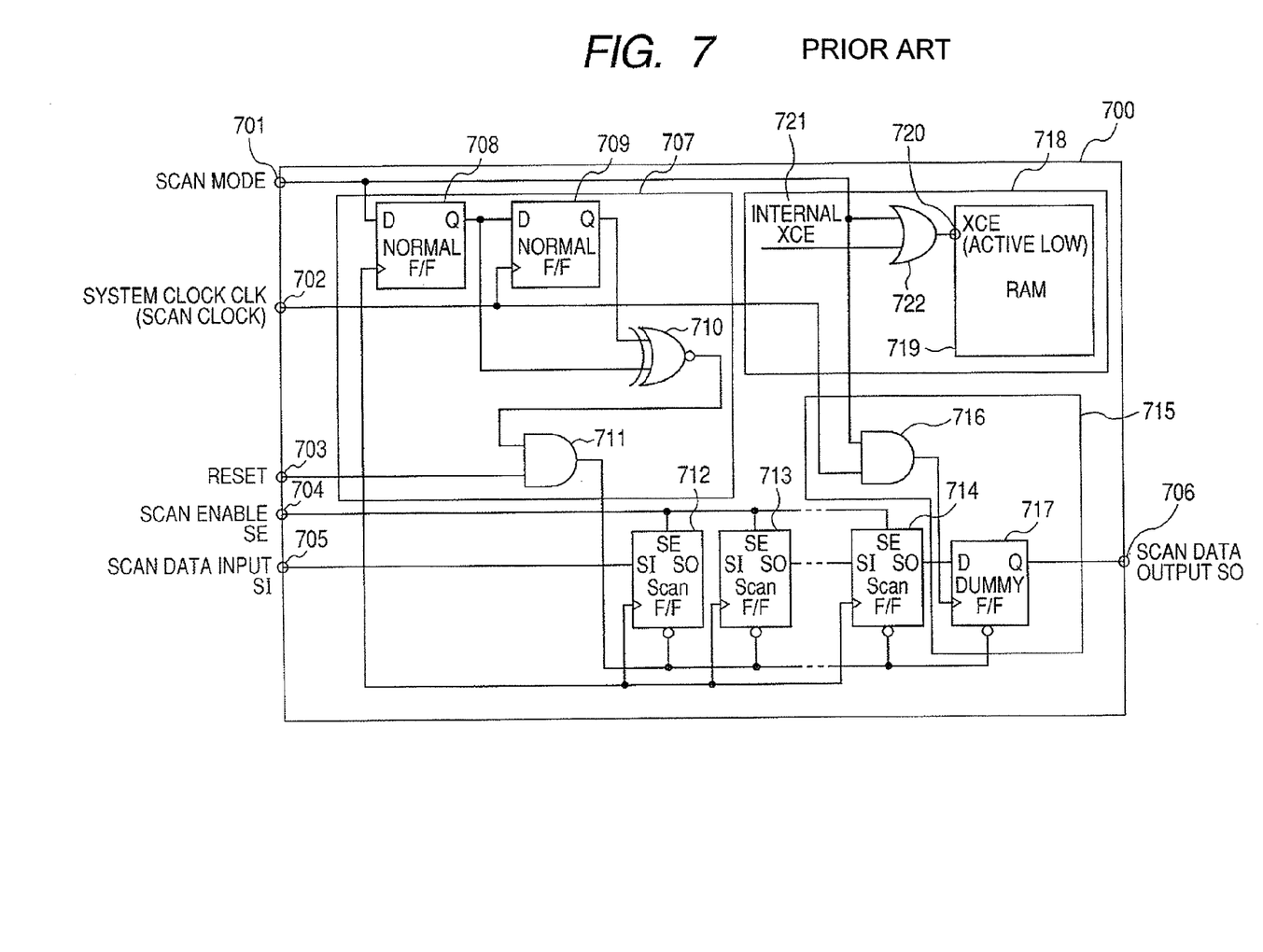
FIG. 7 is a circuit diagram illustrating a scan circuit in consideration of security in the conventional example.

There is Japanese Patent Application Laid-Open No. 2004-117029 which is a Japanese patent and is shown in FIG. 7, as the above described conventional example.

FIG. 7 does not illustrate a circuit system corresponding to an internal circuit 601 shown in FIG. 6, namely, a logic circuit system to be used in a normal operation. In other words, FIG. 7 illustrates only a site directly relating to a scan circuit which has enhanced the security function.

The semiconductor integrated circuit has a circuit 707 which observes a condition of a scan mode signal that switches between a normal operation mode and a test mode of testing the semiconductor integrated circuit by using a scan circuit, and resets a data value of an FF when a scan mode state changes.

The semiconductor integrated circuit also has an access disabling unit 718 for disabling access into an internal RAM while the above described mode signal shows a test mode.

The semiconductor integrated circuit further has an output control unit 715 provided with a dummy FF which outputs supplied data in the test mode and inhibits the output of the supplied data in the normal operation mode.

As described above, a configuration in FIG. 7 shows the following effect.

Figure 8:
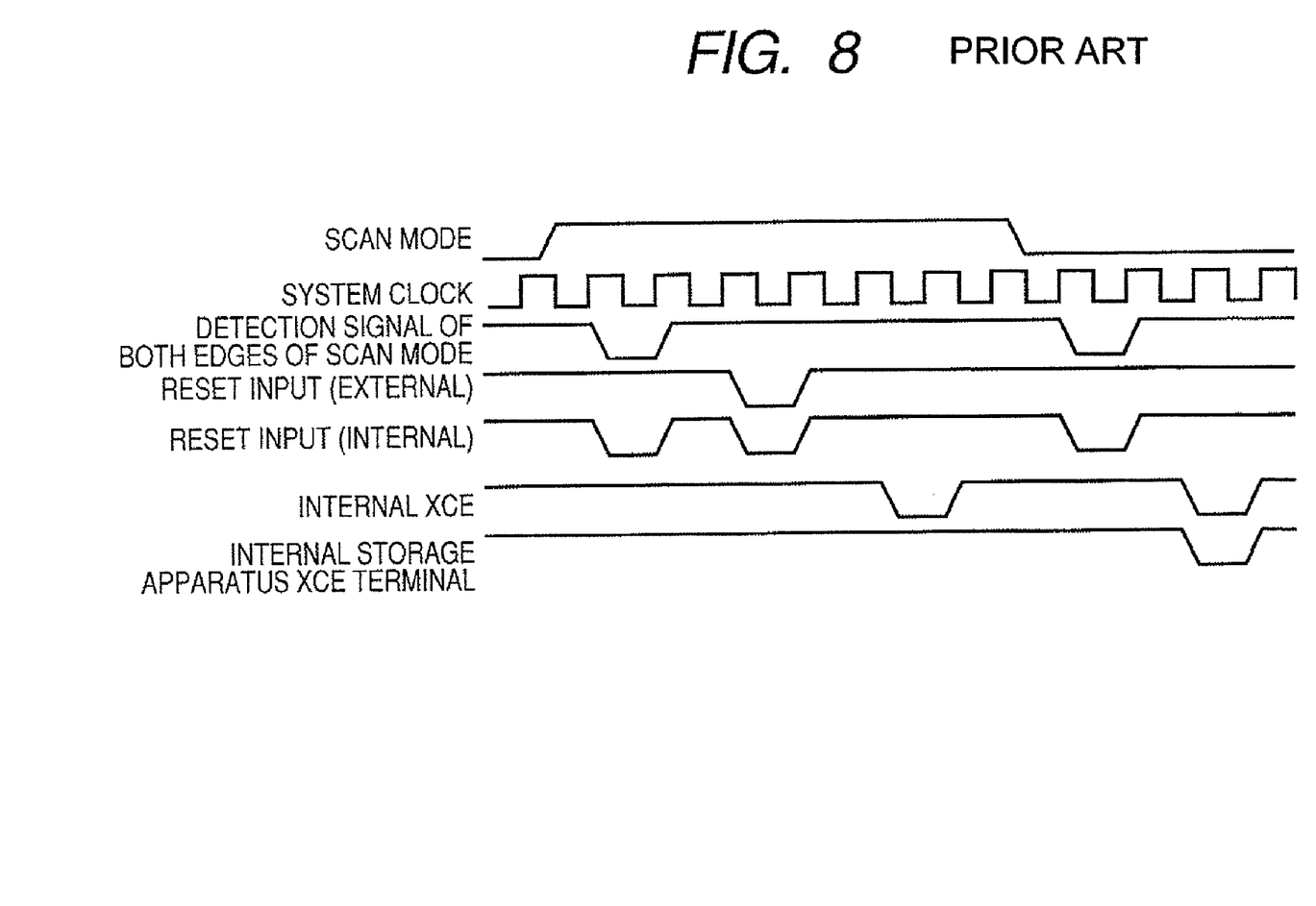
FIG. 8 is a driving waveform chart for describing an operation of a scan circuit in consideration of security in the conventional example illustrated of FIG. 7.

FIG. 8 illustrates a waveform chart showing the operation.

In FIG. 8, the circuit 707 produces a signal of detecting both edges in response to a scan mode signal which selectively designates a test mode and a normal operation mode; and when the signal of detecting both edges and a reset input from the outside satisfy the AND logic, resets an FF which forms a scan chain in each initiating time and terminating time of a scan test.

Accordingly, the circuit 707 can prevent data in a normal operation mode from being drawn when the mode has migrated from a normal operation to a scan test operation, and from being changed through a normal operation by changing the mode with the use of data written in an FF during the scan test operation.

The circuit 700 also masks an internal XCE signal which is controlled in an internal circuit, by using a scan mode signal; thereby disables the access to a memory unit such as a RAM during a scan test by using the scan test operation; and further prevents readout from the memory unit through a scan chain, or writing of an arbitrary value into the memory unit through the normal operation.

Furthermore, the circuit 700 does not supply a clock to a dummy FF in a normal operation mode; thereby disables shifting-output by a scan chain; and accordingly also prevents readout on a value of an internal FF by changing only the scan enable signal during the normal mode and using the scan chain.

However, an integrated circuit configuration in the conventional example has the following problems.

(1) When the circuit enlarges the scale and increases the number of an FF, but prepares a scan test by one scan chain, the scan test needs a long time in proportion to the number of the FF.

Then, in order to shorten a testing period of time, there is a configuration of arranging a plurality of scan chains for forming parallel lines. But the configuration needs an output control unit with the use of the dummy FF in a number corresponding to the scan chains, and enlarges a circuit scale.

(2) A scan mode signal for selectively designating a normal operation mode and a test mode is prepared for preventing a scan test from unintentionally being set or reset, as shown in a scan-FF 606 of FIG. 6, for instance.

However, the scan mode signal is not necessary for a configuration of an integrated circuit using scan-FFs that can be directly controlled by a reset terminal, as shown in a scan-FF 605 of FIG. 6

In spite of it, the integrated circuit in the conventional example can not remove the mode signal in order to disable the access to an internal memory during a scan test, and consequently needs to increase the number of terminals.

(3) There is a configuration of an integrated circuit which does not always need an FF with a non-synchronous set terminal or an FF with a reset terminal, in order to realize a function of a normal operation.

Furthermore, an integrated circuit often avoids the use as much as possible, in order to minimize a circuit scale.

However, in order to reset an FF when a mode signal changes, it is necessary to use an FF with a non-synchronous set terminal and an FF with a reset terminal even for an FF which does not need them in a normal operation, and consequently to enlarge a circuit scale.

The present invention is directed at solving the problems.

SUMMARY OF THE INVENTION

An object of the present invention is to provide an integrated circuit which has a configuration of a small circuit scale, and can carry out a scan test while preventing a security data stored in an LSI from being read out or rewritten by fraudulent means.

Specifically, a semiconductor integrated circuit according to the present invention having a normal operation mode for operating an internal logic circuit with the use of a scan circuit, and a scan test mode for testing the internal logic circuit with the use of the scan circuit includes: a mode decision circuit that receives a signal for controlling which one of data for the normal operation mode and data for the scan test mode should be input to the scan circuit, and that transmits a decision signal corresponding to any one of the normal operation mode and the scan test mode depending on the received signal; and a mask circuit for controlling the input of the decision signal into the scan circuit by carrying out a logical operation of the same signal as one received in the mode decision circuit and the decision signal, wherein the mode decision circuit outputs the decision signal without changing the decision even when a logic level of the received signal in the mode decision circuit is changed.

The scan test mode carries out a scan test for an internal logic circuit with the use of a scan flip-flop forming the scan circuit.

The mode decision circuit changes the decision signal only when having received a reset signal for resetting the scan flip-flop.

The logical operation of mask circuit is an AND logical operation.

The above semiconductor integrated circuit also includes a memory unit connected to the internal logic circuit and an access control unit for disabling the access to the memory unit according to the decision signal.

The access control unit disables the access to the memory unit during a scan test mode.

The semiconductor integrated circuit also uses the signal as an input signal for the normal operation mode in response to the decision signal.

As shown in the above description, a semiconductor integrated circuit according to the present invention provides the following effect. Specifically, a scan shift operation cannot be carried out after a normal operation has been carried out.

In other words, a data retained in an FF through a normal operation cannot be drawn out by a scan shift operation.

Furthermore, the above semiconductor integrated circuit does not cause the increase of a circuit due to replacing an FF without needing a reset terminal with an FF with the reset terminal.

On the other hand, as for a scan test operation, the above semiconductor integrated circuit disables the access to an internal memory unit and serial communication necessary for a normal operation, even when intending to carry out the normal operation during or after the scan test; and accordingly prevents the normal operation from being carried out by fraudulent means.

The above semiconductor integrated circuit also has no need of arranging a dummy FF even when a circuit scale is enlarged and a plurality of scan chains are arranged, and accordingly can prevent the increase of the circuit, The above semiconductor integrated circuit can reduce the number of terminals by using a scan enable terminal and a normal data input terminal in common, or omitting the scan mode terminal.

As described above, the above integrated circuit has an advantage of being capable of carrying out a scan test while preventing a security data stored in an LSI from being read out or rewritten by fraudulent means though having a configuration of a small circuit scale, in comparison with a conventional example.

Further features of the present invention will become apparent from the following description of exemplary embodiments with reference to the attached drawings.

DESCRIPTION OF THE EMBODIMENTS

In the next place, embodiments of the present invention will be described with reference to the accompanying drawings.

First Embodiment

Figure 1:
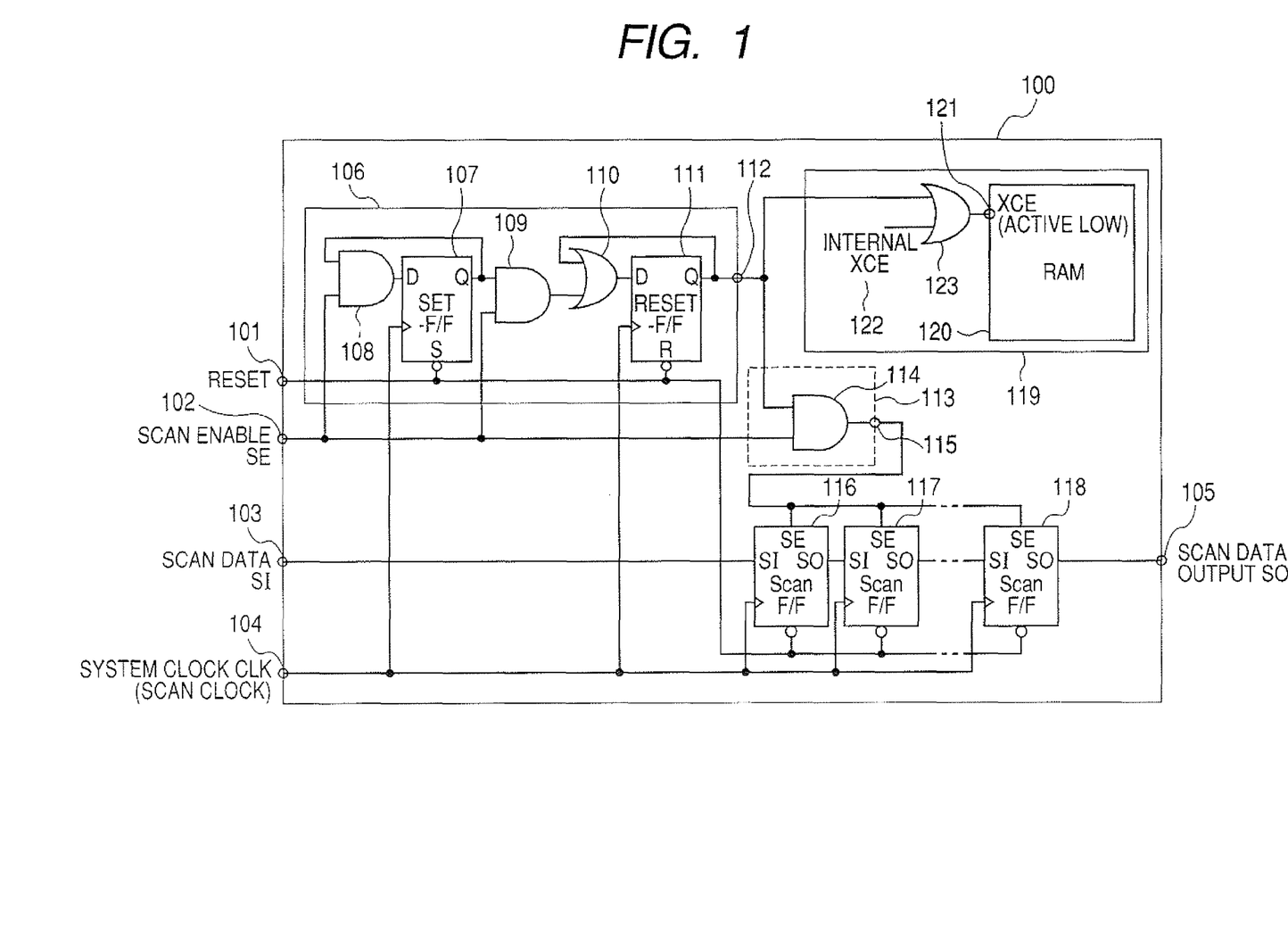
FIG. 1 is a main circuit diagram of a semiconductor integrated circuit according to a first embodiment in the present invention.

FIG. 1 is a view illustrating a circuit configuration of a first exemplary embodiment in the present invention. As in the case of FIG. 7 of a conventional example, FIG. 1 also does not illustrate a circuit system corresponding to an internal circuit 601 illustrated in FIG. 6, namely, a logic circuit system to be used in a normal operation; and illustrates only a part which directly relates to the present invention.

Accordingly, scan-FFs 116 and 117 each shall have a normal operation data input section (D) connected to a normal operation data input terminal (not shown). In addition, reference character SO of the n-th last scan-FFN outputs a data of a normal operation as well.

A semiconductor integrated circuit 100 has a scan data input terminal 103 and a scan data output terminal 105 arranged therein. N sets of scan-FFs from a scan-FF116 to a scan-FFN (for instance, when n=3, N=118) form a scan chain between the scan data input terminal 103 and the scan data output terminal 105.

When the semiconductor integrated circuit 100 is tested by a scan test, a test data (scan pattern) is input into each of a scan-FF116 to a scan-FFN from a scan data input terminal 103. As for a method of inputting the test data into the scan-FF, there is a method of using a serial shift register operation of the scan-FFs as is shown in FIG. 6, but the method is not limited to this.

When a shifting operation of a scan chain is finished, a data to be observed as a scan test result is output from a scan data output terminal 105.

A scan enable signal is input from a scan enable terminal 102.

A scan enable signal is a signal for switching a data to be input to a scan-FF between a normal operation data and a scan data.

As described above, in the present exemplary embodiment, when the scan enable signal is logic zero, a data of a normal operation is input into the scan-FF. On the other hand, when the scan enable signal is logic one, the scan-FFs form a scan chain (not shown). The scan data is input into a scan-FF116, and is sequentially input into the next scan-FF.

A system clock of a semiconductor integrated circuit 100 is input into a system clock input terminal 104. A scan clock is also input into the system clock input terminal 104 when a scan test is carried out. Specifically, the system clock input terminal 104 is used for the clock for a scan shift operation starting from the scan-FF116 and ending in the scan-FFN.

A reset signal for resetting an unillustrated internal circuit in a semiconductor integrated circuit 100 is input into a reset input terminal 101. The reset signal is also used for resetting the scan-FF116 to the scan-FFN.

The semiconductor integrated circuit 100 also has an internal memory unit 120, and enables the above described internal memory unit 120 to be accessed only when a chip enable terminal 121 shows logic zero.

In summary, in the present exemplary embodiment, the following three components compose a semiconductor integrated circuit 100:
1. test mode decision circuit 106;
2. scan enable mask circuit 113 based on result of the test mode decision circuit; and
3. access control unit 119 based on result of the testing mode decision circuit.

In the next place, these circuits will be described in detail.

A test mode decision circuit 106 includes an FF107 with a set, a RESET-FF111, two-input AND gates 108 and 109, and a two-input OR gate 110.

The set input of an FF107 with a set is connected to a reset terminal 101, and the output of a two-input AND gate 108 is connected to the data input of the FF107. One input terminal of the two-input AND gate 108 is connected to a scan enable terminal 102, and the output (Q) of the above described FF107 with a set is fed back and is input into the other input terminal of the two-input AND gate 108.

The reset input of the above described RESET-FF111 is connected to a reset terminal 101, and the output of a two-input OR gate 110 is input into the data input of the RESET-FF111.

The output (Q) of the above described RESET-FF111 is fed back to and is input into one input of a two-input OR gate 110, and the output of the two-input AND gate 109 is input into the other input of the two-input OR gate 110.

One input of a two-input AND gate 109 is connected to a scan enable terminal 102, and an output (Q) of the above described FF107 with a set is input into the other input of the two-input AND gate 109.

The test mode decision circuit 106 has a configuration of using the output (Q) of the above described RESET-FF111 as a decision result 112.

A scan enable mask circuit 113 has a two-input AND gate 114 arranged therein. One input of the two-input AND gate 114 is connected to a scan enable terminal 102.

Into the other input of the two-input AND gate 114, a decision result 112 of the above described test mode decision circuit 106 is input. The scan enable mask circuit 113 has a configuration of using the output of the two-input AND gate 114 as a scan enable mask circuit output 115, and connecting the output 115 to scan enable terminals of the above described scan-FF116 to scan-FFN.

An access control unit 119 has a two-input OR gate 123 arranged therein. One input of the two-input OR gate 123 receives a signal supplied from an unillustrated internal circuit in a semiconductor integrated circuit 100. The signal to be supplied is an internal chip enable signal 122 for enabling an internal memory unit 120 to be accessed in a normal operation.

The other input of the two-input OR gate 123 receives a decision result 112 of the above described test mode decision circuit 106. Thus, the access control unit 119 has a configuration of connecting the output of the two-input OR gate 123 to a chip enable terminal 121 of the above described internal memory unit.

An operation of a semiconductor integrated circuit 100 in FIG. 1 during a scan test the will be sequentially described with reference to FIG. 2.

An operation of the semiconductor integrated circuit 100 in a decision period will be now described with reference to FIG. 2.

In a scan test, logic one is firstly input into a scan enable terminal 102 in order to set a scan pattern at a scan-FF116 to a scan-FFN by a scan shift operation.

Next, a reset level (logic zero) is input into a reset terminal 101. Then, the above described FF107 with a set is set at logic one, and the above described RESET-FF111 is reset at logic zero, which is a decision circuit output 112.

A mask circuit output also shows logic zero, because a decision circuit output 112 is logic zero, which is one input of a two-input AND gate 114 in a mask circuit 113.

Subsequently, a scan clock is input into the FF107 with a set from a clock terminal 104. Then, the FF107 detects the first rising edge.

Then, the FF107 with a set continues outputting the logic one, because an AND gate outputs the logic one due to the logic one set right before the input and the logic one of a scan enable terminal 102.

Furthermore, a two-input AND gate 109 also outputs the logic one, which changes an output of a RESET-FF111 from logic zero to logic one.

Because a decision circuit output 112 outputs logic one, which is also one input of a two-input AND gate 114 in a mask circuit 113, the AND gate outputs logic one due to the above logic one and the logic of a scan enable terminal 102, and consequently, the mask circuit outputs the logic one.

An operation of the semiconductor integrated circuit 100 in a scan shift period will be now described with reference to FIG. 2.

In a period of the scan shift, a scan clock is input in the scan-FF, which consists of the necessary number of clocks for setting a scan data in the scan-FF, while a scan enable terminal 102 continues outputting logic one.

In the period, a scan shift operation can be carried out because both a decision circuit output and a mask circuit output are set at logic one.

An operation of the semiconductor integrated circuit 100 in a scan capture period will be now described with reference to FIG. 2.

In a scan capture period, a scan enable terminal 102 is set at logic zero, and a scan clock is input once.

Then, one input of the above described two-terminal input AND gate 108 is set at logic zero, and consequently, the output is also set at the logic zero. Thereby, the output of the above described FF107 with a set is changed to the logic zero.

However, an input of the above described RESET-FF111 is set at logic one which is a retained previous data and is fed back to the input of the two-input OR gate 110. The logic one is input to the RESET-FF111 from the two-input OR gate 110, so that the logic one is not changed and the decision circuit output retains the logic one.

Because a scan enable terminal 102 is set at logic zero, which is one input of a two-input AND gate 114 in a mask circuit 113, a mask circuit also outputs the logic zero. Accordingly, a scan-FF116 to a scan-FFN can carry out a capture operation.

An operation of the semiconductor integrated circuit 100 in a second or later scan shift period will be now described with reference to FIG. 2.

A scan enable terminal 102 is changed to logic one again, and a scan clock is input.

One input of the above described two-terminal input AND gate 108 is changed to logic one, but the other input of the two-terminal input AND gate 108 is kept at the previous state because the output of the above described FF107 with a set is fed back to the input. Accordingly, the output of the FF107 with the set does not return to the logic one.

Furthermore, an output of the above described RESET-FF111 continues retaining logic one as described above, so that a decision circuit also outputs the logic one and the mask circuit also outputs the logic one again as described above.

A scan test can be carried out by appropriately repeating the above described scan shift operation and the scan capture operation.

An operation of controlling the access to an internal memory unit will be now described with reference to FIG. 2.

There is a case where an input value of an internal XCE is unintentionally changed by the value of a SCAN data.

When a semiconductor integrated circuit 100 is operated by a normal operation, an input terminal of the circuit is set at the same logical value in a scan capture operation, so that the circuit can be operated in a normal operation mode continuously after the above described scan test operation.

Accordingly, an internal circuit can control a value of an internal XCE as treatment in a normal operation.

Figure 2:
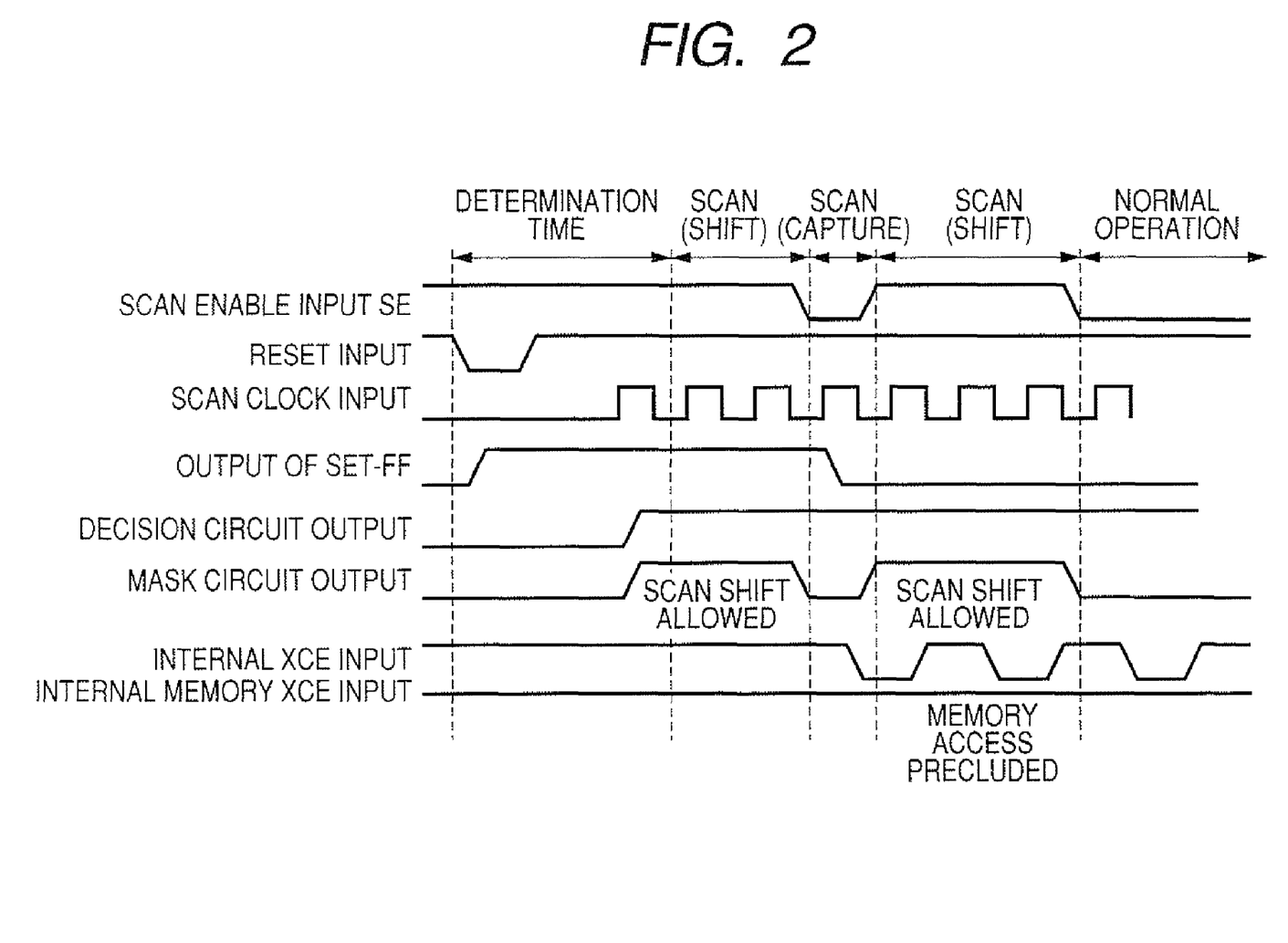
FIG. 2 is a driving waveform chart for describing a scan test operation according to the first embodiment in the present invention.

However, as is illustrated in FIG. 2, a decision circuit output continues retaining logic one after the above described scan operation has been finished.

One input of a two-input OR gate 123 in the above described access control unit 119 is set at logic one, so that an internal XCE is masked and its output is fixed at the logic one.

Accordingly, the access to an internal memory unit is disabled during a scan test and in a normal operation after the scan test.

In other words, an unauthorized access to an internal memory unit with the use of a scan test mode, or an unauthorized access to the internal memory unit by carrying out a normal operation from a state of an unauthorized internal FF are disabled.

Figure 3:
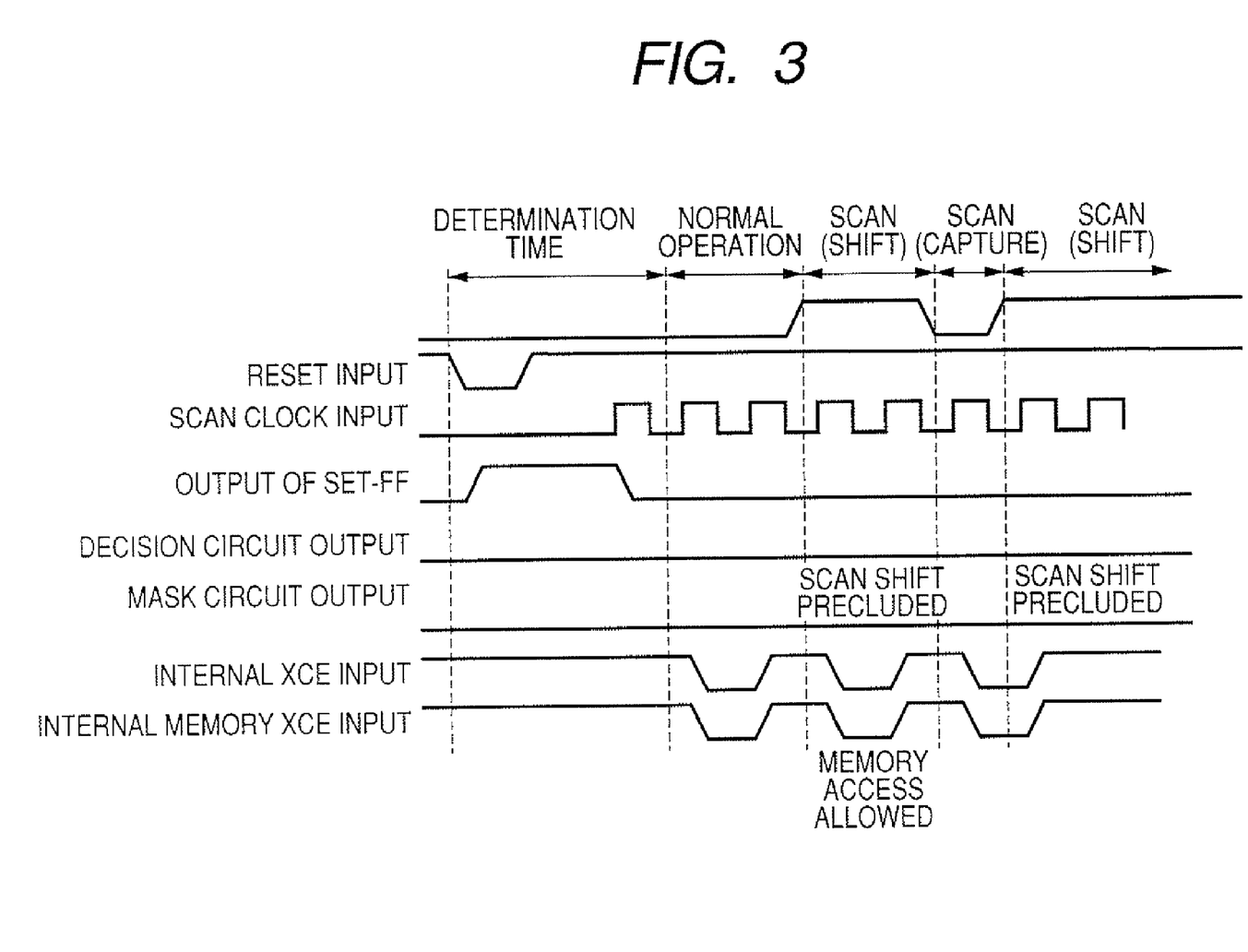
FIG. 3 is a driving waveform chart for describing a normal operation according to the first embodiment in the present invention.

An operation in a normal operation mode in FIG. 1 will be now described sequentially in FIG. 3.

An operation in a decision period in FIG. 3 will be now described.

In a normal operation, logic zero is input into a scan enable terminal 102. Next, when a reset level (logic zero) is input into a reset terminal 101, the above described FF107 with a set is set at logic one, and the above described RESET-FF111 which is a decision circuit output 112 is reset at logic zero.

Because a decision circuit output 112 which is one input of a two-input AND gate 114 of a mask circuit 113 is set at logic zero, the mask circuit also outputs the logic zero.

Next, a system clock is input into an FF107 with a set from a system clock terminal 104, and the FF107 with a set detects a first rising edge. As a result of this, an output of the FF107 with a set is changed to logic zero by an output result from an AND gate due to the logic zero input from a scan enable terminal 102 and logic one which has been set immediately before the input in the FF107 with a set.

An output of a RESET-FF111 is kept at logic zero, because a two-input AND gate 109 also outputs logic zero due to the AND logic working between the output of the FF107 with a set and the logic zero of a scan enable terminal 102.

A decision circuit output 112 is set at logic zero, which is one input of a two-input AND gate 114 in a scan enable mask circuit 113. Accordingly, a mask circuit 113 outputs logic zero which is an output result of the two-input AND gate 114 that has received the above logic zero and the logic of a scan enable terminal 102.

An operation in a scan shift period after a normal operation has been finished will be now described with reference to FIG. 3.

A scan shift operation is carried out by changing a scan enable terminal 102 to logic one and inputting scan clocks with the necessary number for setting a scan data in a scan-FF.

However, one input of the above described two-input AND gate 108 is kept at logic zero, because the logic zero of an output of the above described FF107 with a set is fed back to the input. Accordingly, the output of the FF107 with the set is not changed to logic one.

Accordingly, outputs of a two-input AND gate 109, a two-input OR gate 110 and a RESET-FF111 are not changed to logic one either.

Thus, the decision circuit output retains logic zero, and consequently a mask circuit also outputs logic zero. Accordingly, a scan shift operation cannot be carried out.

From then on, a scan test operation cannot be carried out because a mask circuit keeps outputting logic zero whatever the logic of a scan enable terminal 102 is changed into.

In other words, a shift out operation of a scan shift operation is disabled, after a normal operation has been finished.

An operation of controlling the access to an internal memory unit will be now described with reference to FIG. 3.

In FIG. 3, after a decision circuit has determined the mode as a normal operation mode in the above described decision period, the decision circuit continues outputting logic zero.

Accordingly, an internal XCE is not masked because one input of a two-input OR gate 123 in the above described access control unit 119 receives logic zero. Accordingly, the access to an internal memory unit in a normal operation is enabled when the internal XCE is input into a chip enable terminal 121 without being changed.

Second Embodiment

Figure 4:
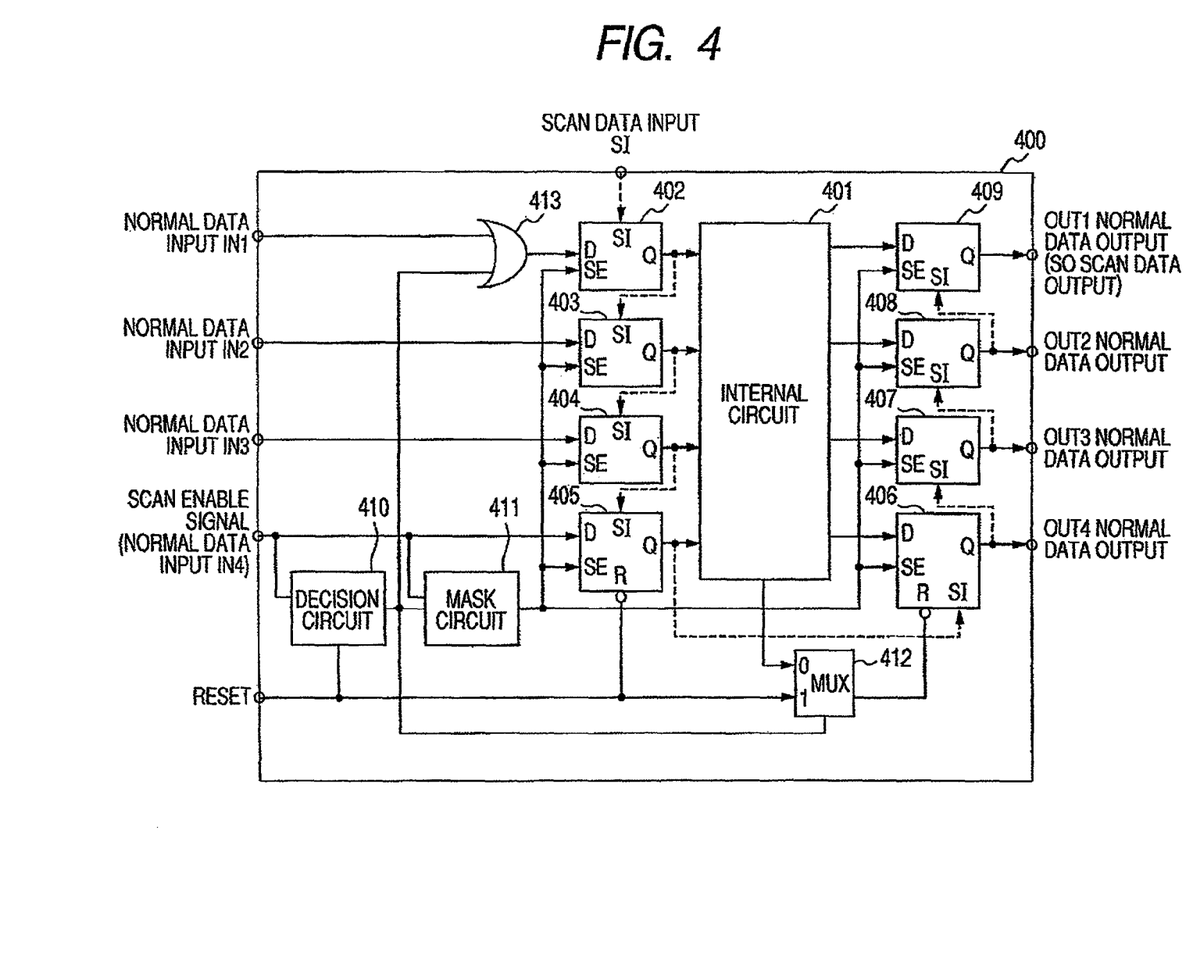
FIG. 4 is a main circuit diagram for describing a scan test operation according to a second embodiment in the present invention.

FIG. 4 is a view illustrating a circuit configuration of a second exemplary embodiment in the present invention.

FIG. 4 illustrates a configuration which has scan-FFs 402 to 409 arranged for inputting a signal into an internal circuit 401 of a semiconductor integrated circuit 400 and receiving an output from the internal circuit 401.

In the present exemplary embodiment, a scan enable signal is input into a scan-FF405 as a normal data input IN4, and is also input into a decision circuit 410 which has been described in Exemplary embodiment 1. This point is different from that in Exemplary embodiment 1.

The present exemplary embodiment has thus configuration of inputting the output of the decision circuit into a mask circuit 411 also shown in the above described Exemplary embodiment 1, and connecting the output of the mask circuit 411 to a scan enable input of scan-FFs 402 to 409.

The normal operation and the scan test can be carried out by using the decision circuit 410 and the mask circuit 411, through the same procedures as those described in FIG. 2 and FIG. 3.

In addition, a scan shift operation cannot be carried out after a decision circuit 410 has determined the mode as a normal operation mode, whatever the signal value of a scan enable terminal 102 is changed to, because of the same reason as described above.

By using the fact, the semiconductor integrated circuit 400 reduces the number of terminals by using a scan enable signal as a normal data input IN4 after the decision circuit 410 has finished a decision period.

Similarly to the above description, the configuration uses the scan enable signal as a selection signal of a multiplexer 412 after the decision circuit 410 has determined the operation as a scan test operation, by using the fact that the decision circuit 410 keeps a decision result at logic one after having finished the decision.

Thereby, a semiconductor integrated circuit 400 prevents a reset input of a scan-FF406 from being unexpectedly reset by an internal circuit 401 when a scan test is carried out, and reduces scan mode terminals.

Furthermore, the semiconductor integrated circuit 400 employs a configuration of making a two-input OR gate 413 receive an output of the multiplexer 412 and a normal data input IN1 and output a result of an OR logic as an input for a scan-FF402.

As a result of this, for instance, when a normal data input IN1 is input from an input data terminal for serial communication, an output of a two-input OR gate 413 is fixed at logic one after a scan test has been carried out.

Accordingly, the semiconductor integrated circuit 400 can disable a serial communication which is an unauthorized normal operation through carrying out a scan test for scan-FFs.

In addition, the semiconductor integrated circuit 400 disables a scan shift operation in itself after a decision circuit 410 has determined the mode as a normal operation mode, as described above.

Thus, the configuration does not need to replace scan-FFs 402 to 404 and 407 to 409 which need not carrying out a reset operation in a normal operation with scan-FFs with a reset terminal, and thereby prevents the expansion of a circuit scale.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-170251, filed Jun. 20, 2006, which is hereby incorporated by reference herein in its entirety.

What is claimed is:

1. A semiconductor integrated circuit operable in a normal operation mode for operating an internal logic circuit using a scan circuit, and a scan test mode for testing the internal logic circuit using the scan circuit, comprising:
   a test mode decision circuit configured to:
      receive a scan enable signal for controlling which one of (1) data for the normal operation mode and (2) data for the scan test mode should be inputted into the scan circuit, and
      generate, based at least in part on the scan enable signal, a decision signal having a logic level corresponding to one of (1) the normal operation mode and (2) the scan test mode; and
   a mask circuit configured to control a masked scan enable signal into the scan circuit by carrying out a logical operation of the scan enable signal and the decision signal,
   wherein, once the decision signal has been generated, the logic level of the decision signal remains unchanged irrespective of a logic level of the scan enable signal.

2. The semiconductor integrated circuit according to claim 1, wherein the scan test mode carries out a scan test for the internal logic circuit using the scan circuit including a scan flip-flop.

3. The semiconductor integrated circuit according to claim 1, wherein the test mode decision circuit changes the decision signal only when having received a reset signal for resetting the scan circuit.

4. The semiconductor integrated circuit according to claim 1, wherein the logical operation of the mask circuit is an AND logical operation.

5. The semiconductor integrated circuit according to claim 1, further comprising a memory unit connected to the internal logic circuit and an access control unit for disabling access to the memory unit according to the decision signal.

6. The semiconductor integrated circuit according to claim 5, wherein the access to the memory unit is disabled during the scan test mode.

7. The semiconductor integrated circuit according to claim 1, wherein the scan enable signal is used as an input signal in the normal operation mode according to the decision signal.

* * * * *